(12) United States Patent
Zelenov et al.

(10) Patent No.: US 9,118,293 B1
(45) Date of Patent: Aug. 25, 2015

(54) METHOD FOR PROCESSING ON MOBILE DEVICE AUDIO SIGNALS OF REMOTELY EXECUTED APPLICATIONS

(71) Applicant: Parallels IP Holdings GmbH, Schaffhausen (CH)

(72) Inventors: Anton Zelenov, Moscow (RU); Stanislav S. Protassov, Moscow (RU); Serguei M. Beloussov, Singapore (SG)

(73) Assignee: Parallels IP Holdings GmbH, Schaffhausen (CH)

( * ) Notice: Subject to any disclaimer, the term of this patent is extended or adjusted under 35 U.S.C. 154(b) by 211 days.

(21) Appl. No.: 14/029,849

(22) Filed: Sep. 18, 2013

(51) Int. Cl.
*H04B 1/16* (2006.01)
*H03G 3/30* (2006.01)

(52) U.S. Cl.
CPC ........... *H03G 3/3005* (2013.01); *H03G 3/3089* (2013.01)

(58) Field of Classification Search
CPC .................................................. H03G 3/3005
USPC ......... 455/412.1, 213, 212; 381/74, 109, 309; 380/279; 709/220; 715/716
See application file for complete search history.

(56) References Cited

U.S. PATENT DOCUMENTS

| | | | |
|---|---|---|---|
| 7,949,355 B2* | 5/2011 | Brown et al. | 455/466 |
| 8,111,842 B2* | 2/2012 | Seguin | 381/109 |
| 8,204,483 B2* | 6/2012 | Bumiller | 455/412.1 |
| 2009/0046868 A1* | 2/2009 | Engle et al. | 381/74 |
| 2014/0126756 A1* | 5/2014 | Gauger, Jr. | 381/309 |
| 2015/0019964 A1* | 1/2015 | Campbell | 715/716 |

* cited by examiner

*Primary Examiner* — MD S Elahee
(74) *Attorney, Agent, or Firm* — Bardmesser Law Group

(57) ABSTRACT

A method and computer program product for running a remote desktop application on a mobile device without audio interference from the other desktop applications, so the remote user applications runs as if it were a native mobile device application. A remote host desktop has a number of applications running simultaneously and producing sounds. A mobile device user selects one application and launches it on his mobile device. The selected application runs on a mobile device and the sounds produced by all other desktop applications are filtered out by special audio control driver implemented on the host system.

8 Claims, 12 Drawing Sheets

CONVENTIONAL ART

METHOD FOR PROCESSING ON MOBILE DEVICE AUDIO SIGNALS OF REMOTELY EXECUTED APPLICATIONS

BACKGROUND OF THE INVENTION

1. Field of the Invention

The present invention relates to a method for downloading views of host desktop applications to a mobile device and filtering sounds of events on host.

2. Description of the Related Art

Often, a mobile device user wants to select and interface with software application from a remote desktop computer on his mobile device as if applications run on the mobile device. The desktop host computer can have several applications running at the same time either required to the user or started end executed independently. The user applications can be running on the host OS or within a virtual environment, such as a Virtual Machine or a container. The user applications running on the host desktop produce different sound streams usually controlled by means of the host desktop.

When a mobile device user selects a particular application running on the remote (host) desktop and launches interface with the application on the mobile device, the audio interface of the mobile device connected to the common audio output of the host desktop may get all the sounds produced by applications running on the remote desktop if the applications form audio streams. For example, a mobile device user selects MICROSOFT Word™ application from the remote desktop. The user, while working with a MS Word™ document, may not want to hear the sounds of the media player running on the host desktop and optionally reflected on the host desktop display means.

In another scenario, a mobile device user selects one media player application and wants to hear only the sounds produced by the media player and not by other media players, for example media plug-ins of internet browser. In other words, when the user "launch" one desktop application on his mobile device he may want to hear the sounds produced by this application only.

A conventional MICROSOFT™ sound processing system is illustrated in FIG. 1. The audio streams from the applications on a host system are collected into the endpoint buffers. Then, each audio stream is passed to the audio engine stream pipe. The audio processing object processes the audio stream and sends it to the system audio processing object (sAPO) filter. Then, the processed application audio streams are mixed in a device pipe. While the system uses third-party APO filters, it does not filter out the audio streams of any of the applications. Thus, the mobile device gets the mixed sounds of all of the applications running on the server or the host desktop.

Currently, there are no means for blocking the sounds produced by other remote desktop applications for the mobile device without stopping the applications on the remote desktop. Yet it is very inconvenient for the user to close all other desktop applications remotely every time he wants to hear one of the applications on his mobile device.

Accordingly, there is a need in the art for a method for reflecting a remote desktop application on a mobile device without audio interference from the other desktop applications running in the same time, so it is a need in the art for reflecting to interface with the remote user application as if it were a native mobile device application.

SUMMARY OF THE INVENTION

Accordingly, the present invention is directed to a method for reflecting or rendering remote desktop application on a mobile device without audio interference from the other desktop applications, so the remote user application runs as if it were a native mobile device application, that substantially obviates one or more of the disadvantages of the related art. The rendering of the application window on the mobile device may be used when some elements of the native application window on the host desktop are dropped from the videostream transmitted from host to mobile device and then are placed over application picture on the mobile device. The element may be a window frame, an image of the pointer such as a mouse pointer, system controls or the like.

According to an exemplary embodiment, a remote host desktop has a number of applications running simultaneously and producing sounds. A mobile device user selects one application and launches it on his mobile device. The selected application runs on a mobile device and the sounds produced by all other desktop applications are filtered out (muted) by a special driver implemented on the host system. Thus, the mobile device user can use the remote desktop application as if it were a local mobile device application.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED FIGURES

The accompanying drawings, which are included to provide a further understanding of the invention and are incorporated in and constitute a part of this specification, illustrate embodiments of the invention and together with the description serve to explain the principles of the invention.

DETAILED DESCRIPTION OF EMBODIMENTS OF THE INVENTION

Reference will now be made in detail to the embodiments of the present invention, examples of which are illustrated in the accompanying drawings.

According to the exemplary embodiment, a remote host desktop has a number of applications running simultaneously and producing various sounds. A mobile device user selects one application as if it is launched it on his mobile device. The selected application is reflected on a mobile device and the sounds produced by all other desktop applications are muted by a special driver implemented on the host system. Thus, the mobile device user can, advantageously, use the remote desktop application as if it were a mobile device application.

Figure 1:
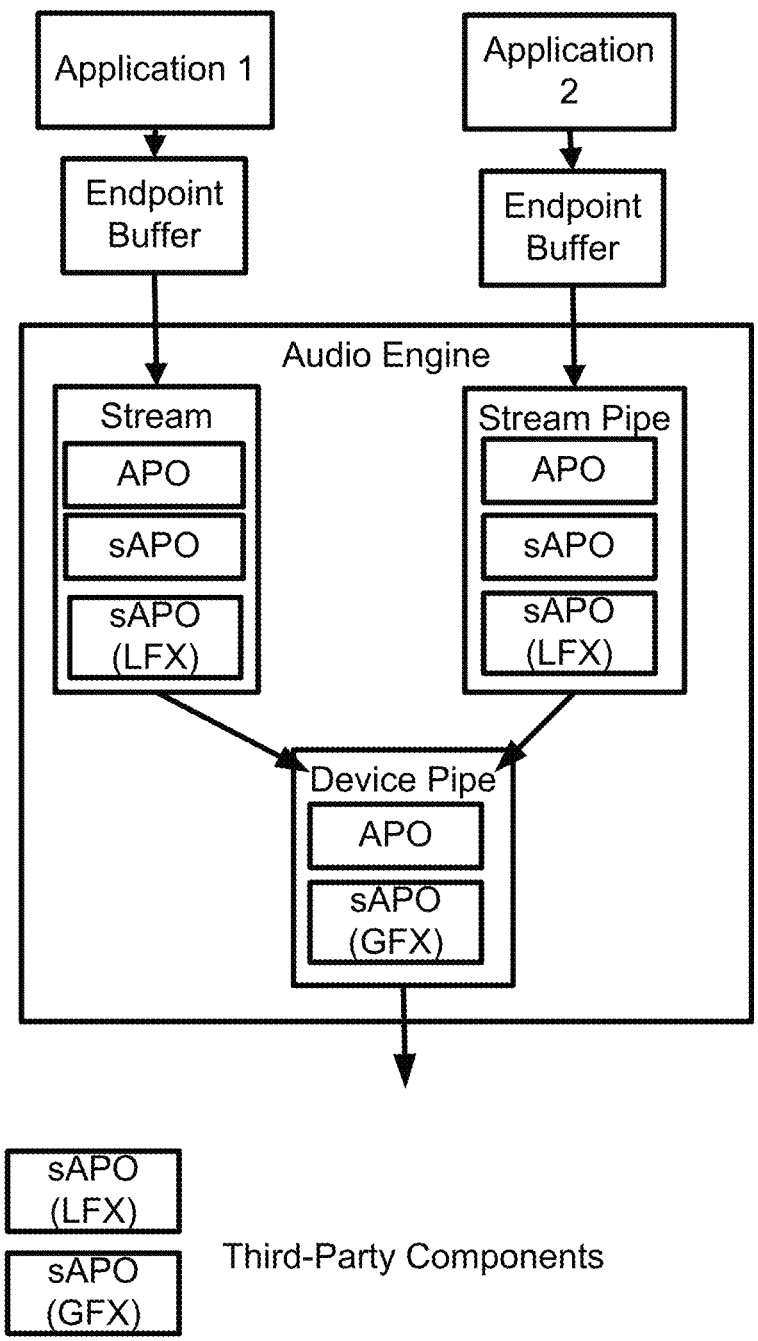
FIG. 1 illustrates a conventional audio processing system.
Figure 2:
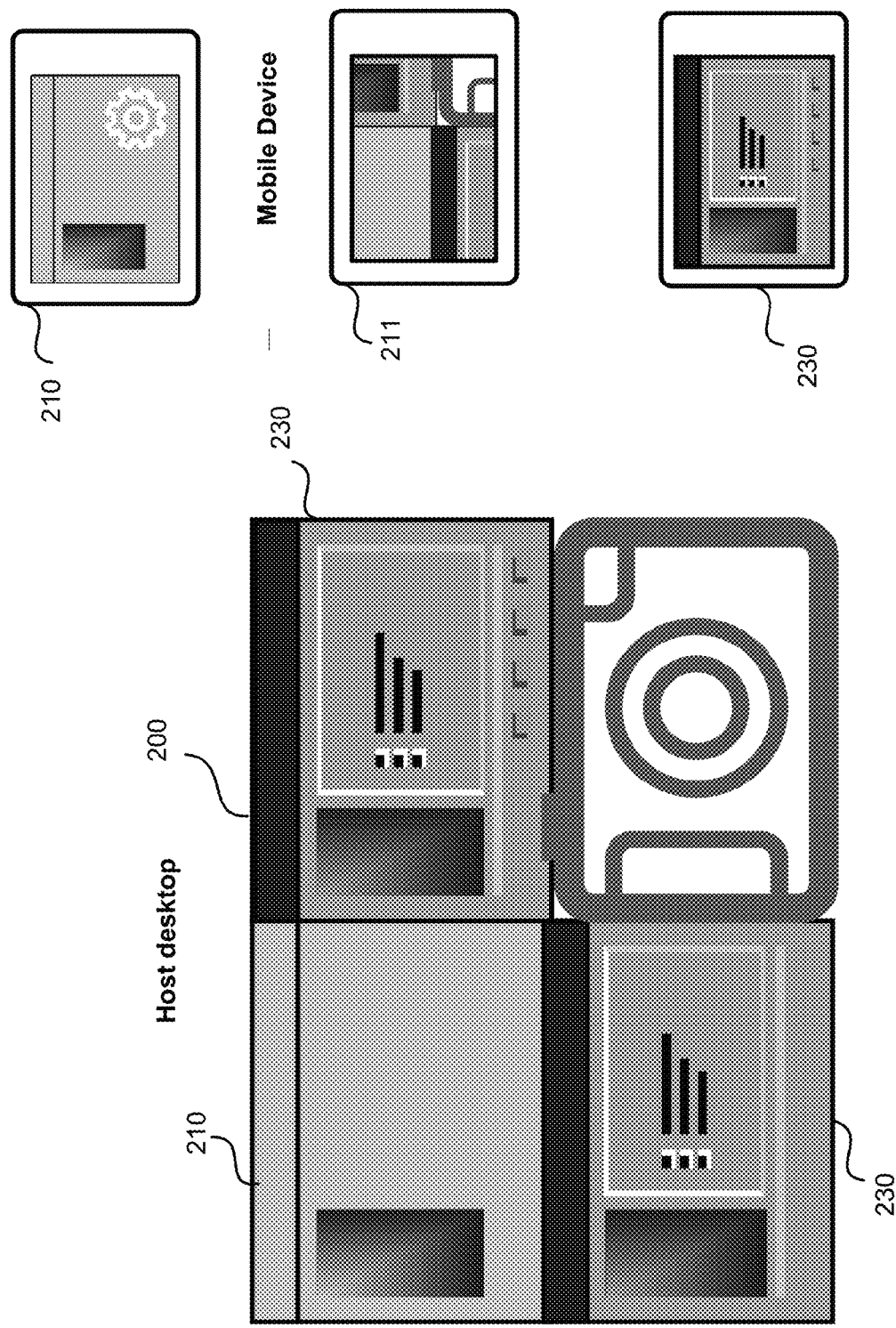
FIG. 2 illustrates an example of desktop applications that can be selected by the mobile device user, in accordance with the exemplary embodiment.

FIG. 2 illustrates an example of desktop applications that can be selected by the mobile device user, in accordance with the exemplary embodiment. The host desktop 200 has applications 210, 220 and 230 running on it. Each of the applications produces its own audio signal. A mobile device 211 user has a window of the host desktop on the screen. When the user selects the application 210 and makes its window active, the application 210 is executed on the mobile device with its own sound. Meanwhile, the sounds of the other inactive applications 230 are filtered out. Thus, the user has experience of the remote application 210 as if it were a local mobile device application.

According to the exemplary embodiment, the host desktop applications are executed simultaneously from the host OS perspective. In other words, all applications have the same execution priority if the application windows are open. In the example depicted in FIG. 2, three applications are running on the host desktop. However, only one selected application window is reflected (i.e., its image is shown) to the mobile user with a corresponding audio signal. According to the exemplary embodiment, the mobile device user can move from one application to another and the application sound changes accordingly.

Figure 3:
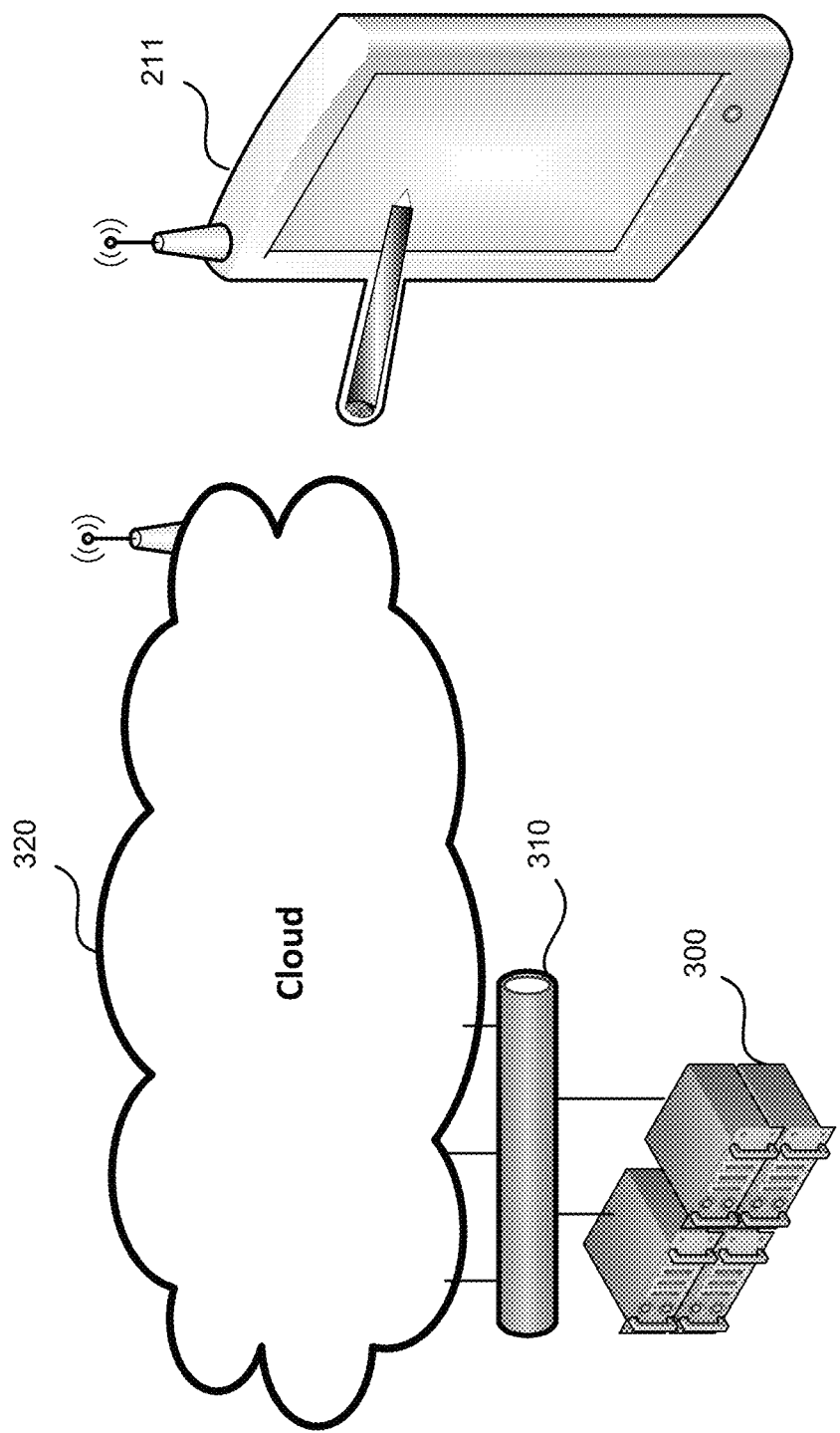
FIG. 3 illustrate an exemplary embodiment where a mobile device uses a cloud service to activate a remote application.

FIG. 3 illustrate an exemplary embodiment where a mobile device uses a cloud service to activate a remote application. The mobile device 211 connects to remote servers 300 that are connected to a cloud 320. The audio streams of the servers' applications go through an audio to network interface 310.

Figure 4:
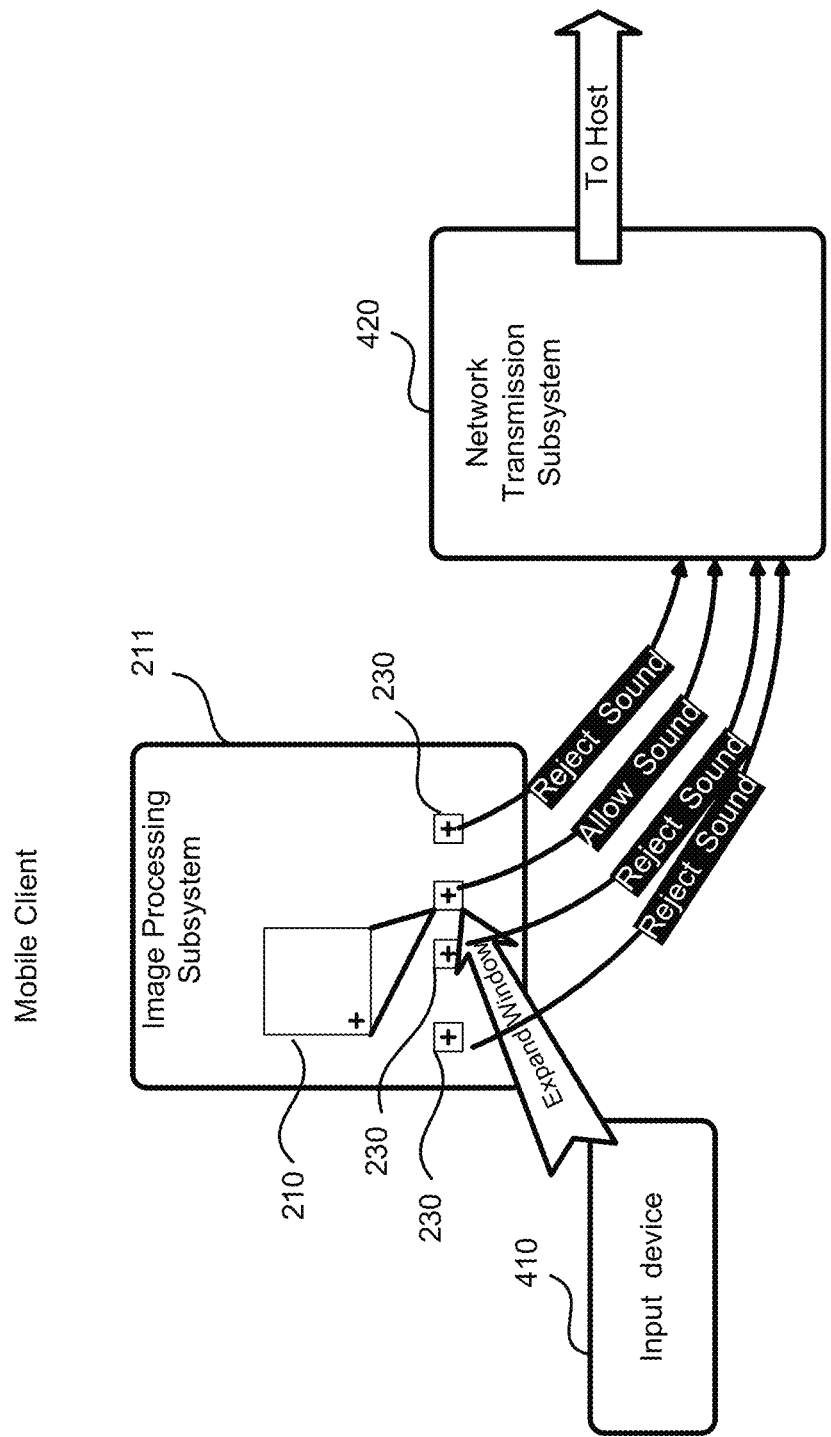
FIG. 4 illustrates how the mobile device provides a feedback to the host desktop for filtering out the sounds of inactive applications.

FIG. 4 illustrates how the mobile device provides a feedback to the host desktop for filtering out the sounds of inactive applications. A mobile device 211 has an image processing subsystem implemented on it. Note that the switching between the desktop applications is rendered on the mobile device without lags which may be a result of the network delays if application for mobile device rendering will be switched on the host.

According to one exemplary embodiment, the desktop application windows are captured separately and a separate video stream is generated for each window. The video streams are sent in parallel to the mobile device, for example, as a broadcast streams. The packets not required by the user are not accepted and are not processed by the mobile device. Only the required application video stream is processed. In one embodiment, the inactive application windows are coded with a low bit rate. After a window becomes active, a request is sent to the remote desktop for increase of the bit rate and for a change of the allowed sound stream.

Alternatively, the sound is transmitted to the mobile device without separation for applications and is formed on the host desktop. This is why the delay or lag exists between application switching and corresponding sound switching. If the sound of inactive window is still received by the mobile device, the sound stream may be muted or faded on the mobile device until the moment when the sound of the "active" application reaches the mobile device. Then the entire signal can be un-muted or unfaded. To simplify the procedure, the ID of the application which sound prevails in the sound stream may be transmitted to the mobile device or other indicator showing that requested switching of the audio stream is performed can be transmitted to the mobile device side.

According to the exemplary embodiment, a plurality of different application windows resides on the host desktop constantly, the entire desktop screen is captured, but only the portion of the desktop containing the required application window selected by the mobile user is shown on the mobile device screen. In other embodiment, a smart codec can be used for capturing and transmitting window from the remote desktop applications. The smart codec can either increase a coding bit rate of an "active" application window or decrease a bit rate of "inactive" windows. The audio streams of applications can be reduced and increased correspondingly. Alternatively, a video system can use a decreased image quality (pixelization) of inactive windows. Thus, the codec uses less computer resources for coding the inactive windows.

A gradual change of the window images can be used when the "active" windows are switched using mobile device hardware and software means when a plurality of video streams is transmitted from the host simultaneously. In one example the switching of the windows can be implemented by sliding over the desktop screen from one window to another or by a quick switch between areas of the host desktop shown to the user on the mobile device screen.

The sliding over the screen with a gradual sound change can be very comfortable for the mobile device user. For the purposes of sound switching each area of the transmitted to the mobile device image can be associated with the application ID. Note that the sounds streams can be switched abruptly on the server and the sound fading out effect can be implemented on the mobile device. The mobile device receives a marker form the server indicating that the application sound stream has been switched to another one.

Alternatively to the smart codec, the image quality can be controlled on the remote desktop where the active application window is reflected in a good quality, for example corresponding to the mobile device screen resolution and other applications windows are rendered on the host device with relatively poor quality and are magnified at the first instance of switching between the applications.

The mobile device 211 has remote desktop application windows 210 and 230 displayed on its screen. A mobile device user activates an application 210 by using an input device 410 (which can be a finger or a stylus on a touch screen). The window of the application 210 becomes active (expended). The image processing subsystem of the mobile device 211 provides an application process ID of the active application 210 to a network transmission subsystem 420 indicating that this application is active and the sound needs to be allowed. The subsystem 420 sends the indication over a network connection. The sent packet contains active application ID (shown in foreground), which allowed to produce sound to the remote device.

The image processing subsystem of the mobile device 211 provides the application process IDs of the inactive applications 230 to a network transmission subsystem 420 indicating that these applications are inactive and the sound needs to be filtered out (i.e., rejected). The network transmission subsystem 420 sends the application IDs to the host system 200. The application ID is a byte type expression. In computing, the process identifier (normally referred to as the process ID or PID) is a number used by most operating system kernels (e.g., UNIX, Mac OS X or Microsoft Windows) to temporarily uniquely identify a process. This number can be used as a parameter in various function calls allowing the processes to be manipulated, such as adjusting the process' priority or killing it altogether. Thus, the host can configure the sound filters accordingly by using a PID of the application.

Figure 5:
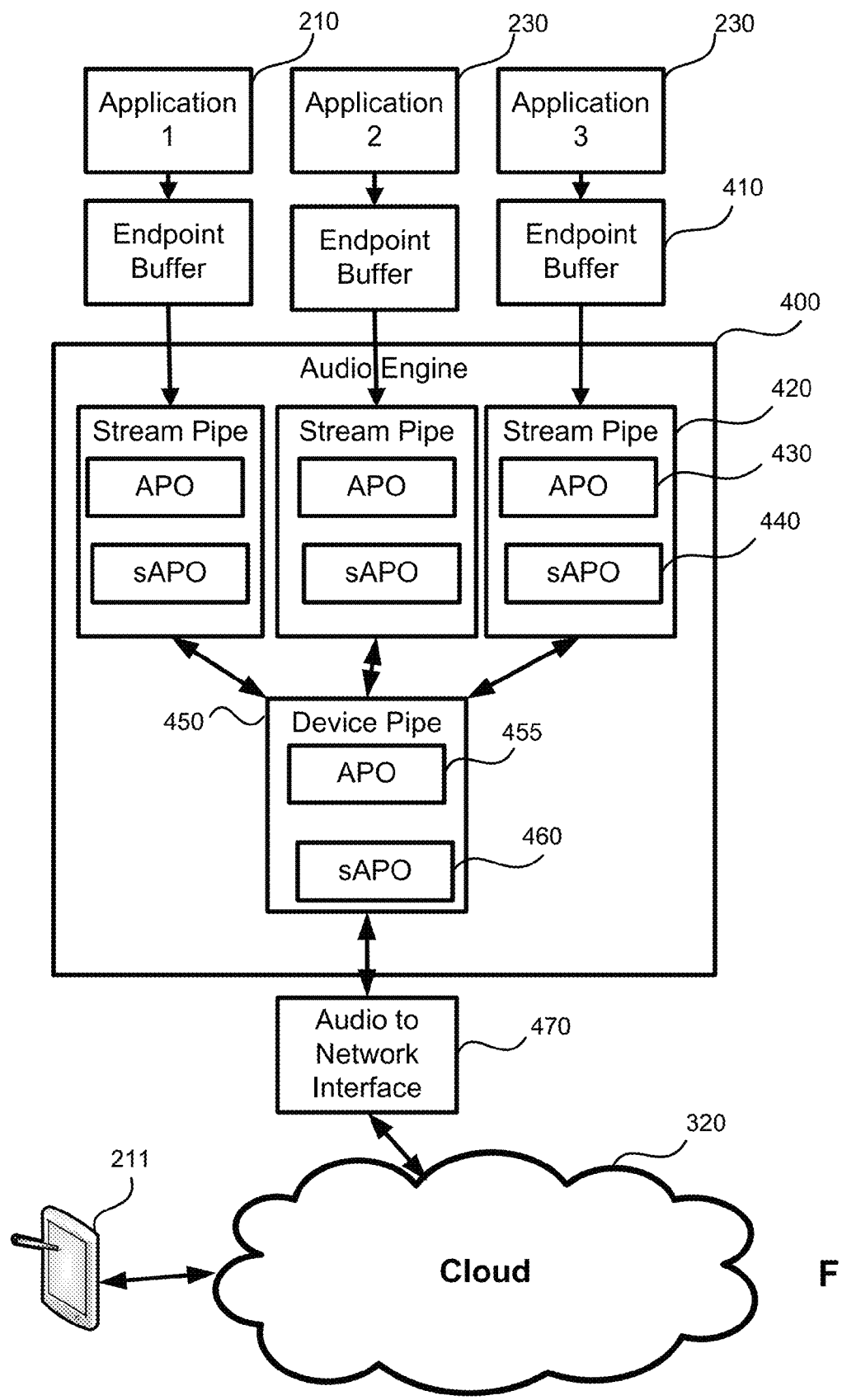
FIG. 5 illustrates a diagram of processing of the application's sounds on the host system.

FIG. 5 illustrates a diagram of processing of the applications' sounds on the host system. The applications 210 and 230 are executed on the host system producing different sounds. For example, the application 210 plays a movie and the applications 230 reflect an interactive flash game. The application APIs provides sound streams to the host system in a format of the respective application. Initially, the sound stream from each application is processed separately in different stages.

First, the sound stream is buffered into endpoint buffers 410. Then, the audio streams are sent the stream pipes 420 of the audio engine 400. The audio streams are processed separately through the application processing objects 430 and through the system application processing objects 440. The applications' audio data streams are mixed in the device pipe 450. The device pipe also has the application processing object 455 and the system application processing object 460. Then, the resulting audio stream is provided to the audio card or an audio card emulator (not shown). Then, the audio stream is sent to the cloud 320 via the audio-to-network interface 470. The mobile device receives the audio stream from the cloud 320.

According to the exemplary embodiment, the proprietary system application processing objects 460 are used. The objects 460 receive data from the mobile device 211 reflecting which of the applications is active. In the example provided in FIG. 4 the application 210 (playing the movie) is active on the mobile device screen. The applications 230 playing the interactive flash games are inactive on the mobile device 211. The application processing objects 460 filter out the sounds from the applications 230. Thus, the resulting audio stream mixed in the device pipe 450 may have only the audio stream of the active application 210.

According to the exemplary embodiment, a mobile device user connects to the host desktop and receives the image with the application windows of the host desktop on his mobile device screen. The mobile device user selects one host desktop application on the mobile device screen. The data containing the application process ID is provided back to the host. The host system switches off (using the proprietary system APO filters) the audio signals of all the applications except for the one selected by the mobile device user. The host captures the window of the selected application and begins to send the captured audio and video data to the mobile device.

According to the exemplary embodiment, the mobile device user interacts with the interfaces of the applications executed on the remote host. The user can employ a full screen mode, where the application window takes up the entire screen of the mobile device (or even expands beyond the mobile device screen borders). The applications interfaces are modified by adding special audio functionality such as volume control. According to the exemplary embodiment, a remote desktop has a system sound stream filter, which is controlled by a mobile device. The sound stream filter can switch the sound streams and create fading out effects. Alternatively, an audio widget can be placed on top of the application window on the mobile device side. The application control panel can have an audio mixing button and an audio on/off button. The mobile device widget does not affect the host configuration settings. The widget has an application volume control.

According to one exemplary embodiment, the widget stores the audio settings of the host system. When a new communication session is established between the mobile device and the host desktop, the audio settings of the host are checked. If the audio settings have changed since the last session, the settings of the application sound filter are changed accordingly. As a simple solution, the previous audio configurations may be restored on the host and/or mobile device. Alternatively, the sound of the application can be increased on the mobile device, if the application sound volume setting or the whole system volume on the desktop is reduced since the last session. Note that if the system volume is increased and the application volume is low, the volume of the filter can remain the same. The same approach can be used with an equalizer, because the sound frequency characteristics of the mobile devices and of the stationary sound diffusers are very different and if the user uses desktop directly between mobile sessions he can change sound frequency settings accordingly.

According to one exemplary embodiment, the host audio configurations are recorded to the memory of the mobile device when the current communication session is closed. Also settings may be stored in the cloud. The host settings can be configured to prevent user from stunning user from system sounds that cannot be regulated by the separate controlled filters.

According to another exemplary embodiment, an interface of a mobile device screen is modified to control of audio settings. For example, an area corresponding to a few pixels at the right screen boarder may be designated for stylus or finger vertical movements regulating the sound volume. The upper screen area may be designated for lateral movements for switching the active applications. For the applications like Media Player or Microsoft Messenger, the application interface can be changed for producing an audio signal in a background mode. According to the exemplary embodiment, the applications running on the host system form the audio streams of the same priority.

Note that the exemplary embodiment allows for setting different priorities for different audio streams according to the current view of the mobile device desktop image. In other words, some applications are given a priority and their audio stream is not filtered out (muted) even if the corresponding application window is not active on the mobile device. The user can close the application window on the mobile device and on the host desktop. For example, an application manager, which controls application reflecting on the mobile device desktop, can emulate closing (or folding) of the application window or it can send a window closing (folding) command to the host device, if the mobile user does not use the application window for a certain time. Alternatively, the mobile user can have a tool for closing the application window. For example, the Android™ OS has a functionality for hiding the application window, while the application remains active but invisible. Thus, stopping the application is rather difficult. The Android™ OS has a functionality for closing the application as well.

Once the mobile device user closes the application window, the corresponding audio signal of this application is muted. Note that the host desktop view may not change, but its representation on the mobile device changes. The application selection on the mobile device is hidden from the host system OS. For example, the resolution of the host desktop is nine times higher than that of the mobile device. If the host has a screen resolution of 3000×1800 and the mobile device has the resolution 1000×600, the mobile device can reflect $\frac{1}{9}^{th}$ of the desktop without much loss in quality. Thus, the navigation through the remote desktop from the mobile device is simplified.

Alternatively, the scaling of the desktop on the mobile device with or without some quality losses can be implemented. For example, the scaling ratio can be selected for convenient use of TTF fonts on the mobile device. In terms of scaling, a view of the host desktop is not important. The host desktop applications form audio streams according to the OS APIs. Then, the audio streams are filtered according to user configurations (received from the mobile device). The audio streams of different applications are mixed according to certain rules provided by the mobile device. The active application on the mobile device has a priority for receiving the application sound. The rules can include gradual muting of the application sound or implementing a special delay when switching from one active application window to another. During the delay time the sound of an old application is gradually muted and the sound volume of the new active application is gradually increased.

Alternatively, the rules can be set inside a server application installed on the remote host. The audio streams of different applications are mixed according to certain rules and converted into audio frames before being passed on to the video card for playback. According to the exemplary embodiment, the resulting host audio data is sent to the virtual audio card, which serves as an interface between the OS and the data transmission protocol (e.g., TCP/IP). The audio stream is converted into data, which can be played by a local mobile device audio card.

According to the exemplary embodiment, the mobile device converts the mixed audio stream received from the host into a real sound. A standard minimum set of controls such as volume and equalizer can be used. Note that the audio streams are mixed on the host and the local audio card does not mix any audio streams. The frame buffer of the sound card is not accessible by the host system. According to the exemplary embodiment, in order to form the sound and send it to the mobile device an emulator of the host sound card is used. The sound card emulator provides significant advantages. Additional drivers do not need to be installed and host system does not need to be reconfigured. A digital sound stream intended for the sound card is interrupted and coded into a convenient format (i.g., OGG, MP3, WMR). Thus, the proposed system is very flexible and has minimal configuration requirements. The mobile device has limited resources compared to the remote host system. The exemplary embodiment, advantageously, performs all audio processing on the host system.

According to the exemplary embodiment, each application has a dedicated audio filter. Alternatively, a number of filters correspond to a number of open application windows. This increases the quality of prioritizing of the audio streams. A filter has a logic that gets most of its data from its standard input (the main input stream) and writes its main results to its standard output (the main output stream).

According to the exemplary embodiment, the APO filters are used to process applications' audio streams as shown in FIG. 5. The sound characteristics (i.e., such as volume, pitch, attenuation) are controlled by the applications. The external filters are used for a constant sound processing according to the system requirements. According to the exemplary embodiment, the controllable audio filters are used for controlling the intensity of the applications' audio streams. In one exemplary embodiment, the intensity of the applications' audio streams can be controlled along with the pitch. Alternatively, only the pitch and stereo effects can be changed.

For example, an application in the right side of the screen can produce a stereo sound on the right side, the application on the left produces the stereo sound on the left side of the screen and a background application produces a mono sound with suppression of high and low frequencies. Thus, the background application does not hinder the sounds of the other applications.

Figure 6:
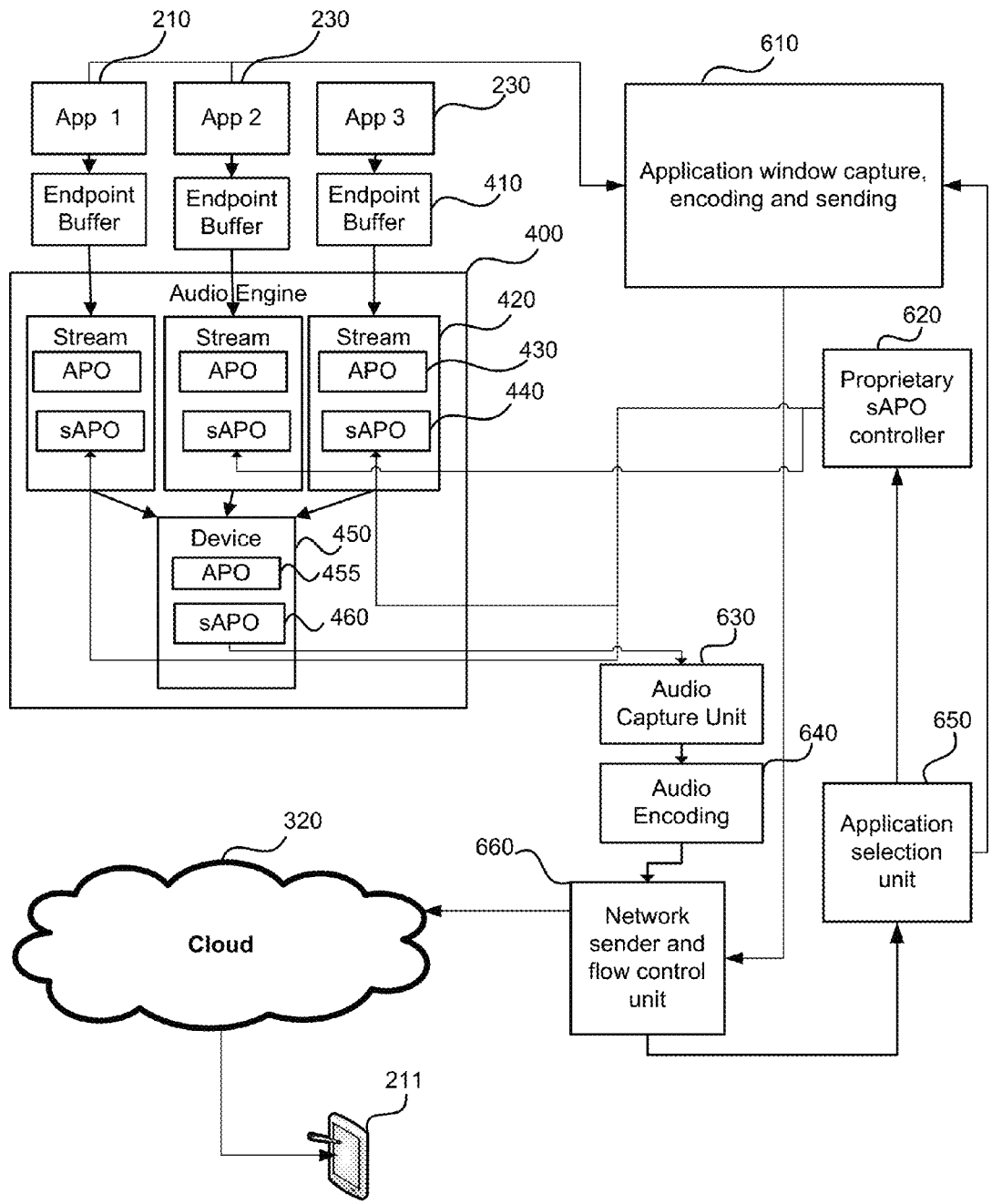
FIG. 6 illustrates a detailed diagram of processing of the application's sounds, in accordance with the exemplary embodiment.

FIG. 6 illustrates a detailed diagram of processing of the application's sounds, in accordance with the exemplary embodiment. The applications 210 and 230 are executed on the host system producing different sounds. The applications' APIs provide a sound stream to the host system in a format of the respective application. Initially, the sound stream from each application is processed separately in different stages.

First, the sound stream is buffered into endpoint buffers 410. Then, the audio streams are sent the stream pipes 420 of the audio engine 400. The audio streams are processed separately through the application processing objects 430 and through the system application processing objects 440. The applications' audio data streams are mixed in the device pipe 450. The device pipe also has the application processing object 455 and the system application processing object 460. Then, the resulting audio stream is provided to the audio card or an audio capture unit 630. The audio stream is encoded in the audio encoding module 640.

The encoded audio stream is provided to the network sender and flow control module 660. Then, the audio stream is sent over the cloud 320 to the mobile device 211. According to the exemplary embodiment, the network sender and flow control module 660 also provides application-related data (application ID and sound settings for each application) to the application selection unit 650, which initiates application window capture, encoding and sending in block 610. The network sender and flow control module 660 also provides the application-related data to the proprietary system APO controller 620, which controls the system APOs 440 that filter out the applications' audio signals. Note that the sound settings can be stored on the server as well.

As discussed above, the proprietary system application processing objects 460 are used. The objects 460 receive data from the mobile device 211 reflecting which of the applications is active. In the example depicted in FIG. 4, the application 210 (playing the movie) is active on the mobile device screen. The applications 230 playing the interactive flash game are inactive on the mobile device 211. The application processing objects 460 filter out the sounds from the applications 230. Thus, the resulting audio stream sent to the mobile device 211 only contains the audio stream of the application 210.

Figure 7:
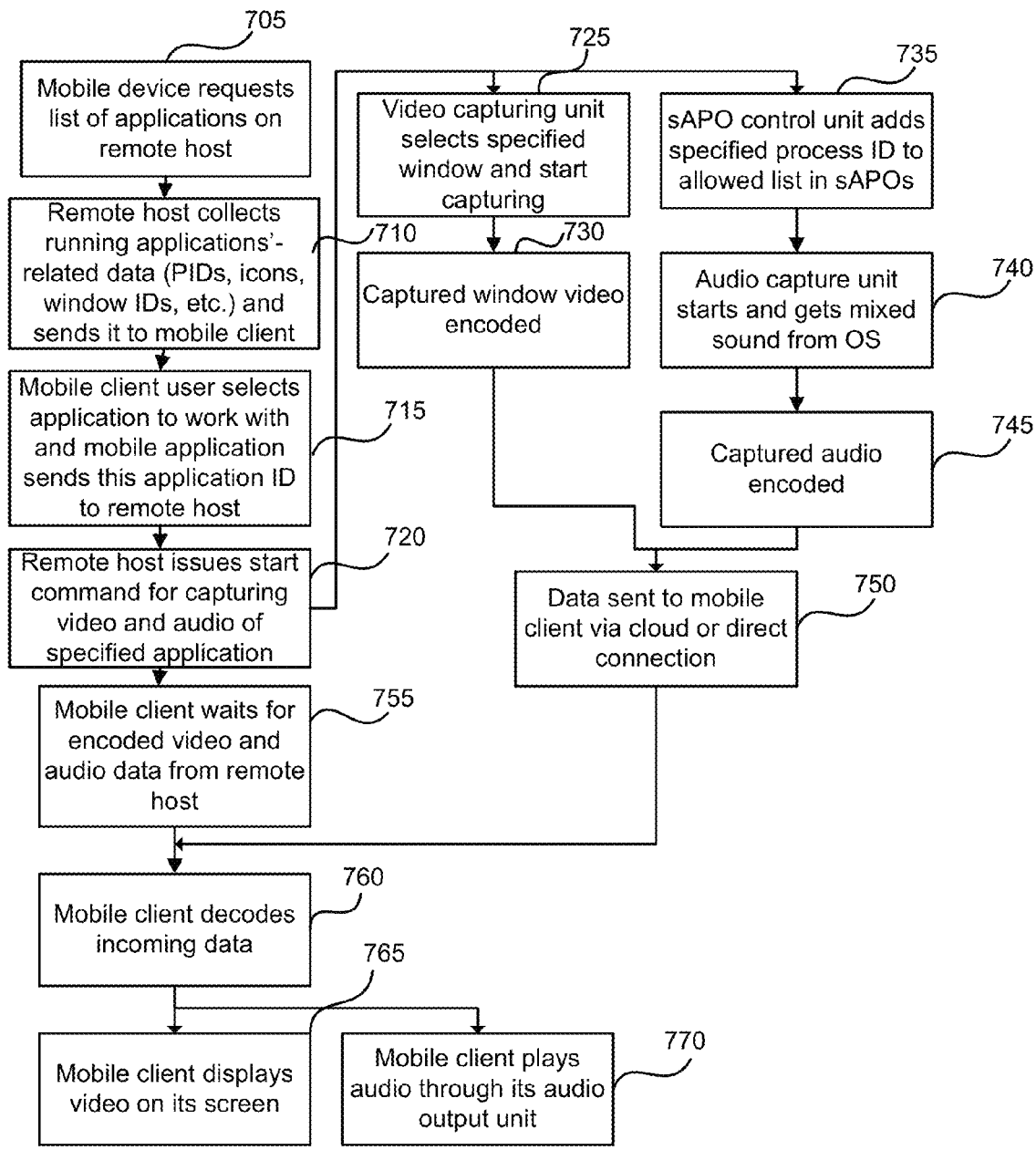
FIG. 7 illustrates a flow chart of the application audio processing in accordance with the exemplary embodiment.

FIG. 7 illustrates a flow chart of the application audio processing, in accordance with the exemplary embodiment. In step 705, a mobile device requests a list of applications running on a remote host desktop. The remote host collects applications' data (process IDs, icons, window IDs) and sends it to the mobile device in step 710. A mobile device user selects an application to use and a proprietary mobile application sends the corresponding application ID to the remote host in step 715.

The remote host, in step 720, issues a start command for capturing the video and the audio data of the selected application. In step 755, the mobile client waits for encoded video and audio data from the remote host. Meanwhile, a video capturing unit selects a specified application window and starts the capturing process in step 725. The captured window video is encoded in step 730.

In step 735, the proprietary system APO controller adds application process ID to allowed list in the system APOs. The audio capture unit starts and gets the mixed audio stream from the host OS in step 740. The captured audio signal is encoded in step 745. The video and audio data is sent to the mobile device via a cloud or through a direct connection in step 750. The mobile client decodes the incoming data (audio and video) from the remote host in step 760. The mobile client reflects the video on its screen in step 765. The mobile client plays the audio through its output unit in step 770.

Figure 8:
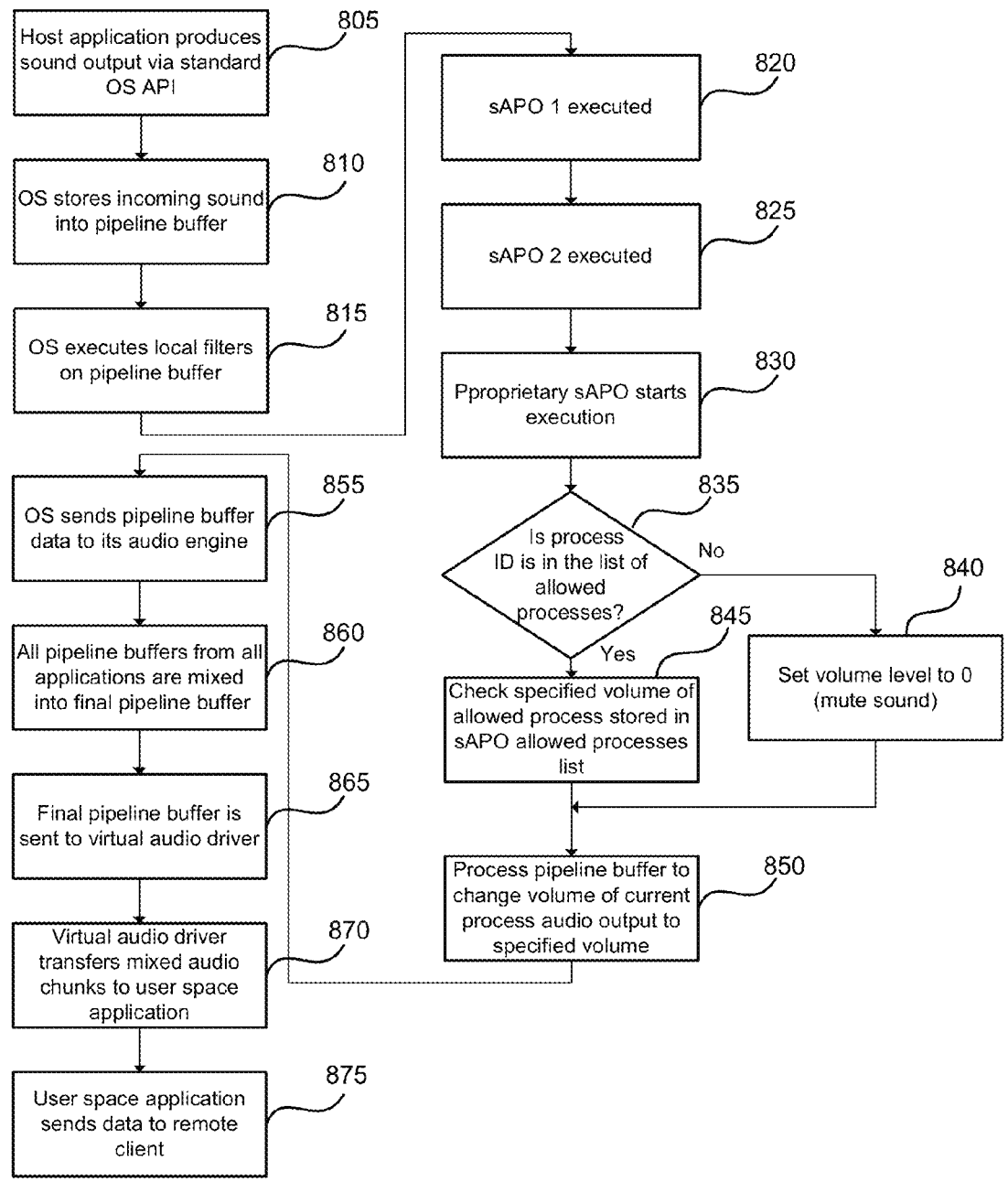
FIG. 8 illustrates a flow chart of the application audio filtering in accordance with the exemplary embodiment.

FIG. 8 illustrates a flow chart of the application audio filtering in accordance with the exemplary embodiment. In step 805, the host application produces sound output via a standard host OS API. In step 810, the host OS stores the incoming sound into the pipeline. Then, the OS executes local filters on the pipeline in step 815. The first system APO is executed in step 820 and the second system APO is executed in step 825. Then, a special filter—the proprietary system APO—starts execution in step 830. The filter checks if the application process ID is in the list of allowed processes in step 835.

If the application process ID is not in the list, the audio volume level is set to zero (i.e., the sound is muted) in step 840. Otherwise, the filter checks the specified volume of the allowed process stored in the system APO allowed process list in step 845. Then, in step 850, the pipeline is processed to change volume of the current process audio output to a specified volume level.

Figure 9:
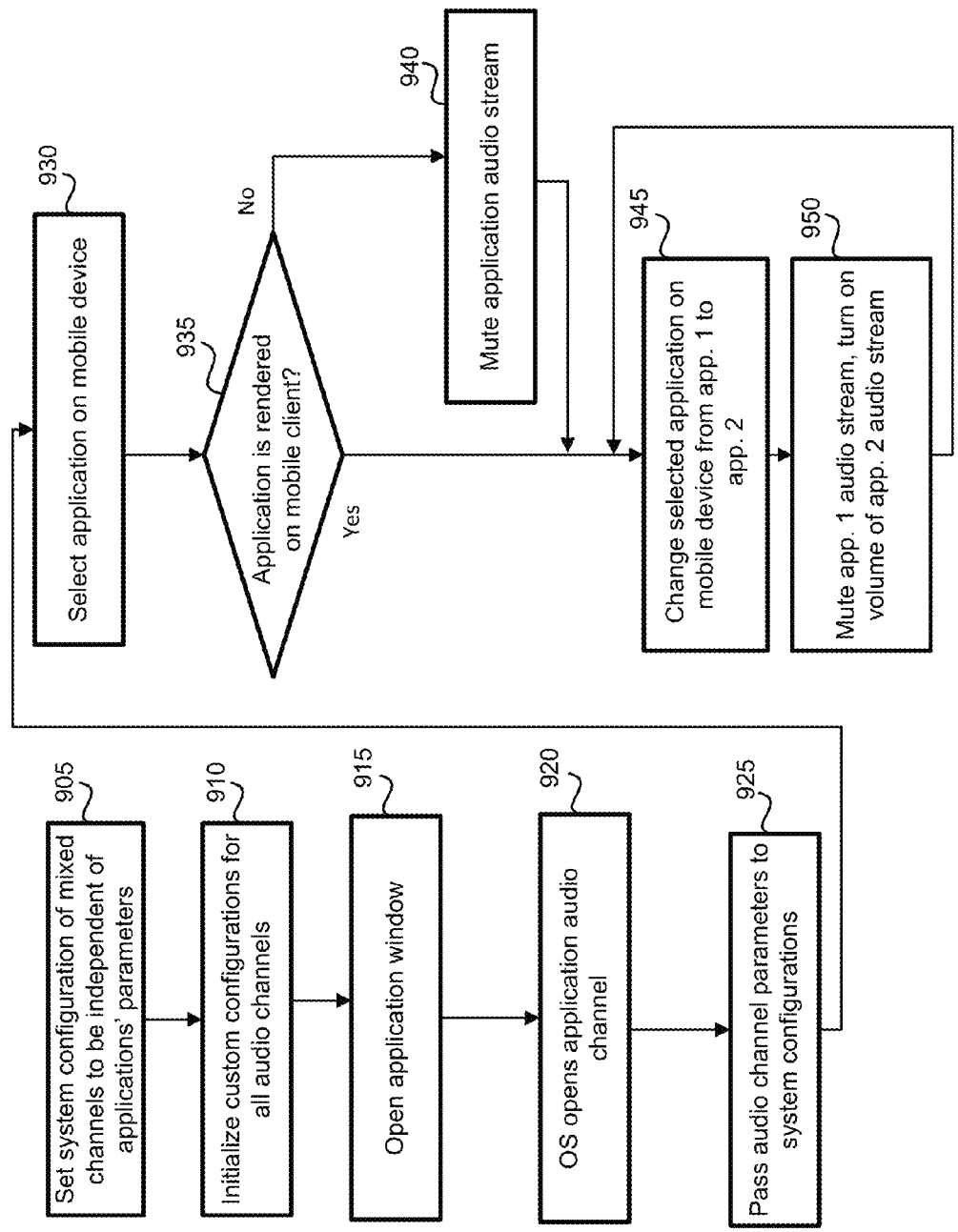
FIG. 9 illustrates a flow chart for audio processing when a mobile device user moves from one application to another.

FIG. 9 illustrates a flow chart for audio processing when a mobile device user moves from one application to another. In step 905 the process sets system configuration of mixed channels to be independent of applications' parameters. In step 910, the custom configurations for all audio channels are initialized. The host desktop application window is open in step 920. In step 925, the audio channel parameters are passed to system configurations. In step 930, the application is selected on the mobile device. If, in step 935, the application window is not reflected on the mobile client, the audio stream of the application is muted by the APO filters. Otherwise, the user can select a different application in step 945 and the sound of the previously reflected on the screen application is muted and the volume of the selected application is turned on in step 950.

A filter is a computer program or routine to process a data stream implemented as a programmable module that gets most of its data from its standard input (the main input stream) and writes its main results to its standard output (the main output stream). According to the exemplary embodiment, the filters are controlled by a special APO controller (see 620 in FIG. 6). The sAPO filter can also be embedded into the system API.

According to the exemplary embodiment, the proprietary sAPO filter only works with a virtual audio card. In one embodiment, an external control signal controls muting or turning on the application (or window) sound. The control signal is generated by a manager module which controls the window or the desktop on the mobile device. The manager module provides navigation through the audio streams. The control signals for application sounds are formed in parallel with the navigation. The manager can control application windows and record their parameters. For example, a resolution of the window can be changed by changing the size of the window. Thus, the small window can be expended on the mobile device. The manager module can also control the window size on the host desktop and expending the window on the mobile device.

According to another exemplary embodiment, the application representation (image) for mobile device is formed on the remote host and as a video stream to the mobile device according to the size of the mobile device screen. In this case, a control procedure determines which window is reflected on the mobile device and provides the priority of the corresponding audio stream by muting all other applications' sounds.

According to one exemplary embodiment, the mobile device receives an application window that does not fit the mobile device screen. For example, the application window image can be sent using RDP protocol, which provides for scaling of the application window to fit the mobile device screen. In this case, the control signal can be generated by the mobile device, which sends application-related data to the host and the host provides the priority of the corresponding audio stream.

Note that sound and video are continuously transmitted in parallel and independently. According to one exemplary embodiment, the areas of the host desktop used for rendering the desktop application windows have identifiers assigned to the desktop areas. When a particular host desktop area is reflected on the mobile device, the audio stream with the corresponding identifier has a priority. According to yet another exemplary embodiment, the intensity of audio stream is determined by the relative brightness of the application window rendered on the mobile device when the application is switched off by dimming.

Note that the sound of inactive applications can be muted gradually. Alternatively, the sound of the application that becomes inactive (i.e., closed by the user) can change according to Doppler's effect. According to another exemplary embodiment, the mobile device screen can have several application windows and the audio volume of each of the applications can be defined by the square area occupied by the application on the screen.

Figure 10:
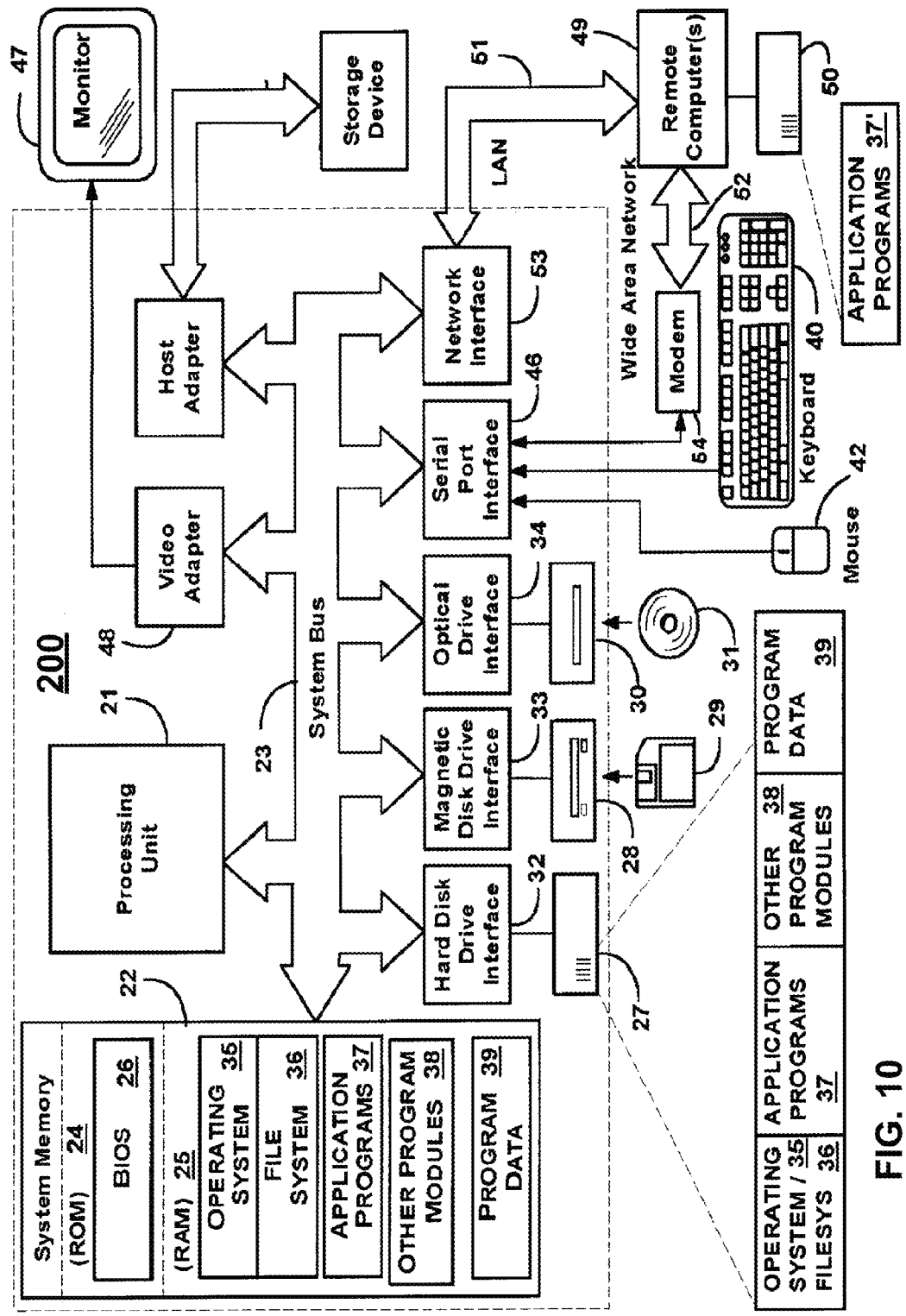
FIG. 10 illustrates a schematic diagram of an exemplary computer or server that can be used in the invention.

With reference to FIG. 10, an exemplary system for implementing the invention includes a general purpose computing device in the form of a personal computer (or a host server) 200 or server or the like, including a processing unit 21, a system memory 22, and a system bus 23 that couples various system components including the system memory to the processing unit 21. The system bus 23 may be any of several types of bus structures including a memory bus or memory controller, a peripheral bus, and a local bus using any of a variety of bus architectures. The system memory includes read-only memory (ROM) 24 and random access memory (RAM) 25.

A basic input/output system 26 (BIOS), containing the basic routines that help to transfer information between elements within the computer 200, such as during start-up, is stored in ROM 24. The personal computer/node 200 may further include a hard disk drive for reading from and writing to a hard disk, not shown, a magnetic disk drive 28 for reading from or writing to a removable magnetic disk 29, and an optical disk drive 30 for reading from or writing to a removable optical disk 31 such as a CD-ROM, DVD-ROM or other optical media.

The hard disk drive, magnetic disk drive 28, and optical disk drive 30 are connected to the system bus 23 by a hard disk drive interface 32, a magnetic disk drive interface 33, and an optical drive interface 34, respectively. The drives and their associated computer-readable media provide non-volatile storage of computer readable instructions, data structures, program modules and other data for the personal computer 200.

Although the exemplary environment described herein employs a hard disk, a removable magnetic disk 29 and a removable optical disk 31, it should be appreciated by those skilled in the art that other types of computer readable media that can store data that is accessible by a computer, such as magnetic cassettes, flash memory cards, digital video disks, Bernoulli cartridges, random access memories (RAMs), read-only memories (ROMs) and the like may also be used in the exemplary operating environment.

A number of program modules may be stored on the hard disk, magnetic disk 29, optical disk 31, ROM 24 or RAM 25, including an operating system 35 (preferably WINDOWS™ 2000). The computer 200 includes a file system 36 associated with or included within the operating system 35, such as the WINDOWS NT™ File System (NTFS), one or more application programs 37, other program modules 38 and program data 39. A user may enter commands and information into the personal computer 100 through input devices such as a keyboard 40 and pointing device 42.

Other input devices (not shown) may include a microphone, joystick, game pad, satellite dish, scanner or the like. These and other input devices are often connected to the processing unit 21 through a serial port interface 46 that is coupled to the system bus, but may be connected by other interfaces, such as a parallel port, game port or universal serial bus (USB). A monitor 47 or other type of display device is also connected to the system bus 23 via an interface, such as a video adapter 48.

In addition to the monitor 47, personal computers typically include other peripheral output devices (not shown), such as speakers and printers. A data storage device, such as a hard disk drive, a magnetic tape, or other type of storage device is also connected to the system bus 23 via an interface, such as a host adapter via a connection interface, such as Integrated Drive Electronics (IDE), Advanced Technology Attachment (ATA), Ultra ATA, Small Computer System Interface (SCSI), SATA, Serial SCSI and the like.

The computer 200 may operate in a networked environment using logical connections to one or more remote computers 49. The remote computer (or computers) 49 may be another personal computer, a server, a router, a network PC, a peer device or other common network node, and typically includes many or all of the elements described above relative to the computer 200.

The computer 200 may further include a memory storage device 50. The logical connections include a local area network (LAN) 51 and a wide area network (WAN) 52. Such networking environments are commonplace in offices, enterprise-wide computer networks, Intranets and the Internet. When used in a LAN networking environment, the personal computer 200 is connected to the local area network 51 through a network interface or adapter 53.

When used in a WAN networking environment, the personal computer 100 typically includes a modem 54 or other means for establishing communications over the wide area network 52, such as the Internet. The modem 54, which may be internal or external, is connected to the system bus 23 via the serial port interface 46. In a networked environment, program modules depicted relative to the personal computer 200, or portions thereof, may be stored in the remote memory storage device. It will be appreciated that the network connections shown are exemplary and other means of establishing a communications link between the computers may be used.

Figure 11:
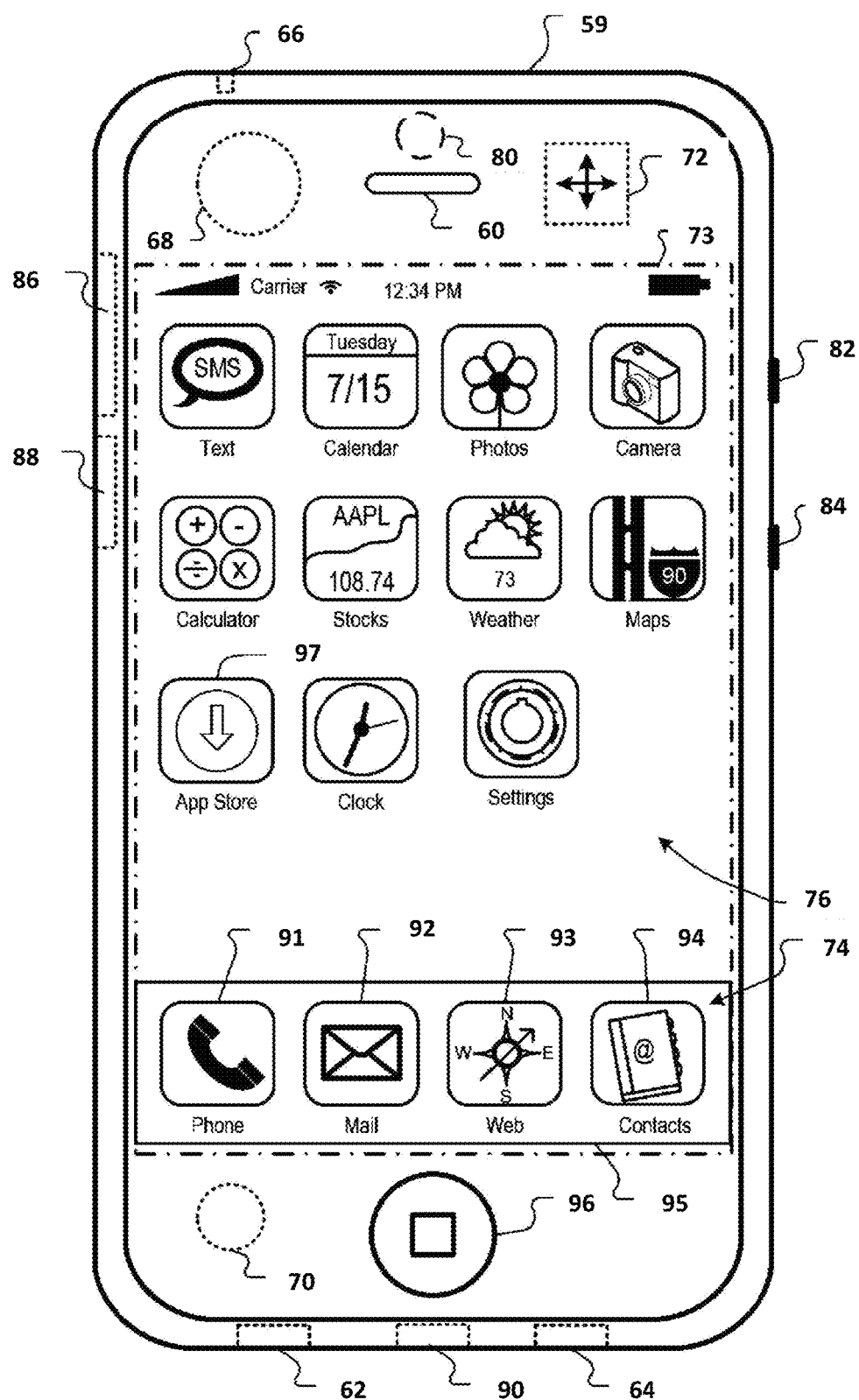
FIG. 11 is a block diagram of a mobile device on which the invention can be implemented.

FIG. 11 is a block diagram of a mobile device 59 on which the invention can be implemented. The mobile device 59 can be, for example, a personal digital assistant, a cellular telephone, a network appliance, a camera, a smart phone, a tablet, an enhanced general packet radio service (EGPRS) mobile phone, a network base station, a media player, a navigation device, an email device, a game console, or a combination of any two or more of these data processing devices or other data processing devices.

In some implementations, the mobile device 59 includes a touch-sensitive display 73. The touch-sensitive display 73 can implement liquid crystal display (LCD) technology, light emitting polymer display (LPD) technology, or some other display technology. The touch-sensitive display 73 can be sensitive to tactile contact with a user.

In some implementations, the touch-sensitive display 73 can comprise a multi-touch-sensitive display 73. A multi-touch-sensitive display 73 can, for example, process multiple simultaneous touch points, including processing data related to the pressure, degree and/or position of each touch point. Such processing facilitates gestures and interactions with multiple fingers, chording, and other interactions. Other touch-sensitive display technologies can also be used, e.g., a display in which contact is made using a stylus or other pointing device.

In some implementations, the mobile device 59 can display one or more graphical user interfaces on the touch-sensitive display 73 for providing the user access to various system objects and for conveying information to the user. In some implementations, the graphical user interface can include one or more display objects 74, 76. In the example shown, the display objects 74, 76, are graphic representations of system objects. Some examples of system objects include device functions, applications, windows, files, alerts, events, or other identifiable system objects.

In some implementations, the mobile device 59 can implement multiple device functionalities, such as a telephony device, as indicated by a phone object 91; an e-mail device, as indicated by the e-mail object 92; a network data communication device, as indicated by the Web object 93; a Wi-Fi base station device (not shown); and a media processing device, as indicated by the media player object 94. In some implementations, particular display objects 74, e.g., the phone object 91, the e-mail object 92, the Web object 93, and the media player object 94, can be displayed in a menu bar 95. In some implementations, device functionalities can be accessed from a top-level graphical user interface, such as the graphical user interface illustrated in the figure. Touching one of the objects 91, 92, 93 or 94 can, for example, invoke corresponding functionality.

In some implementations, the mobile device 59 can implement network distribution functionality. For example, the functionality can enable the user to take the mobile device 59 and its associated network while traveling. In particular, the mobile device 59 can extend Internet access (e.g., Wi-Fi) to other wireless devices in the vicinity. For example, mobile device 59 can be configured as a base station for one or more devices. As such, mobile device 59 can grant or deny network access to other wireless devices.

In some implementations, upon invocation of device functionality, the graphical user interface of the mobile device 59 changes, or is augmented or replaced with another user interface or user interface elements, to facilitate user access to particular functions associated with the corresponding device functionality.

For example, in response to a user touching the phone object 91, the graphical user interface of the touch-sensitive display 73 may present display objects related to various phone functions; likewise, touching of the email object 92 may cause the graphical user interface to present display objects related to various e-mail functions; touching the Web object 93 may cause the graphical user interface to present display objects related to various Web-surfing functions; and touching the media player object 94 may cause the graphical user interface to present display objects related to various media processing functions.

In some implementations, the top-level graphical user interface environment or state can be restored by pressing a button 96 located near the bottom of the mobile device 59. In some implementations, functionality of each corresponding device may have corresponding "home" display objects displayed on the touch-sensitive display 73, and the graphical user interface environment can be restored by pressing the "home" display object.

In some implementations, the top-level graphical user interface can include additional display objects 76, such as a short messaging service (SMS) object, a calendar object, a photos object, a camera object, a calculator object, a stocks object, a weather object, a maps object, a notes object, a clock object, an address book object, a settings object, and an app store object 97. Touching the SMS display object can, for example, invoke an SMS messaging environment and supporting functionality; likewise, each selection of a display object can invoke a corresponding object environment and functionality.

Additional and/or different display objects can also be displayed in the graphical user interface. For example, if the device 59 is functioning as a base station for other devices, one or more "connection" objects may appear in the graphical user interface to indicate the connection. In some implementations, the display objects 76 can be configured by a user, e.g., a user may specify which display objects 76 are displayed, and/or may download additional applications or other software that provides other functionalities and corresponding display objects.

In some implementations, the mobile device 59 can include one or more input/output (I/O) devices and/or sensor devices. For example, a speaker 60 and a microphone 62 can be included to facilitate voice-enabled functionalities, such as phone and voice mail functions. In some implementations, an up/down button 84 for volume control of the speaker 60 and the microphone 62 can be included. The mobile device 59 can also include an on/off button 82 for a ring indicator of incoming phone calls. In some implementations, a loud speaker 64 can be included to facilitate hands-free voice functionalities, such as speaker phone functions. An audio jack 66 can also be included for use of headphones and/or a microphone.

In some implementations, a proximity sensor 68 can be included to facilitate the detection of the user positioning the mobile device 59 proximate to the user's ear and, in response, to disengage the touch-sensitive display 73 to prevent accidental function invocations. In some implementations, the touch-sensitive display 73 can be turned off to conserve additional power when the mobile device 59 is proximate to the user's ear.

Other sensors can also be used. For example, in some implementations, an ambient light sensor 70 can be utilized to facilitate adjusting the brightness of the touch-sensitive display 73. In some implementations, an accelerometer 72 can be utilized to detect movement of the mobile device 59, as indicated by the directional arrows. Accordingly, display objects and/or media can be presented according to a detected orientation, e.g., portrait or landscape.

In some implementations, the mobile device 59 may include circuitry and sensors for supporting a location determining capability, such as that provided by the global positioning system (GPS) or other positioning systems (e.g., systems using Wi-Fi access points, television signals, cellular grids, Uniform Resource Locators (URLs)). In some implementations, a positioning system (e.g., a GPS receiver) can be integrated into the mobile device 59 or provided as a separate device that can be coupled to the mobile device 59 through an interface (e.g., port device 90) to provide access to location-based services.

The mobile device 59 can also include a camera lens and sensor 80. In some implementations, the camera lens and sensor 80 can be located on the back surface of the mobile device 59. The camera can capture still images and/or video. The mobile device 59 can also include one or more wireless communication subsystems, such as an 802.11b/g communication device 86, and/or a BLUETOOTH communication device 88. Other communication protocols can also be supported, including other 802.x communication protocols (e.g., WiMax, Wi-Fi, 3G, LTE), code division multiple access (CDMA), global system for mobile communications (GSM), Enhanced Data GSM Environment (EDGE), etc.

In some implementations, the port device 90, e.g., a Universal Serial Bus (USB) port, or a docking port, or some other wired port connection, is included. The port device 90 can, for example, be utilized to establish a wired connection to other computing devices, such as other communication devices 59, network access devices, a personal computer, a printer, or other processing devices capable of receiving and/or transmitting data. In some implementations, the port device 90 allows the mobile device 59 to synchronize with a host device using one or more protocols, such as, for example, the TCP/IP, HTTP, UDP and any other known protocol. In some implementations, a TCP/IP over USB protocol can be used.

Figure 12:
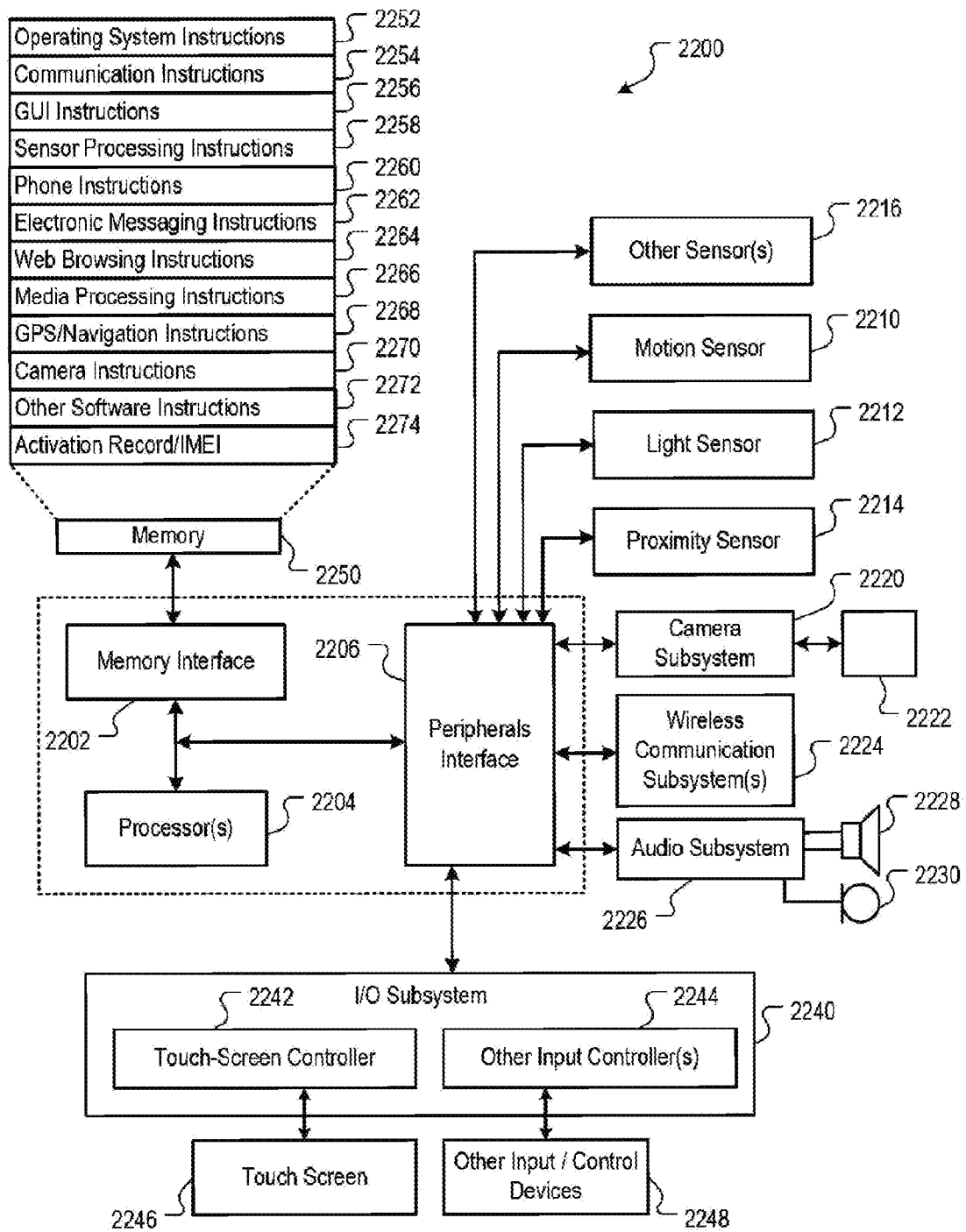
FIG. 12 is a block diagram of an exemplary implementation of the mobile device.

FIG. 12 is a block diagram 2200 of an example implementation of the mobile device 59. The mobile device 59 can include a memory interface 2202, one or more data processors, image processors and/or central processing units 2204, and a peripherals interface 2206. The memory interface 2202, the one or more processors 2204 and/or the peripherals interface 2206 can be separate components or can be integrated in one or more integrated circuits. The various components in the mobile device 59 can be coupled by one or more communication buses or signal lines.

Sensors, devices and subsystems can be coupled to the peripherals interface 2206 to facilitate multiple functionalities. For example, a motion sensor 2210, a light sensor 2212, and a proximity sensor 2214 can be coupled to the peripherals interface 2206 to facilitate the orientation, lighting and proximity functions described above. Other sensors 2216 can also be connected to the peripherals interface 2206, such as a positioning system (e.g., GPS receiver), a temperature sensor, a biometric sensor, or other sensing device, to facilitate related functionalities.

A camera subsystem 2220 and an optical sensor 2222, e.g., a charged coupled device (CCD) or a complementary metal-oxide semiconductor (CMOS) optical sensor, can be utilized to facilitate camera functions, such as recording photographs and video clips.

Communication functions can be facilitated through one or more wireless communication subsystems 2224, which can include radio frequency receivers and transmitters and/or optical (e.g., infrared) receivers and transmitters. The specific design and implementation of the communication subsystem 2224 can depend on the communication network(s) over which the mobile device 59 is intended to operate. For example, a mobile device 59 may include communication subsystems 2224 designed to operate over a GSM network, a GPRS network, an EDGE network, a Wi-Fi or WiMax network, and a BLUETOOTH network. In particular, the wireless communication subsystems 2224 may include hosting protocols such that the device 59 may be configured as a base station for other wireless devices.

An audio subsystem 2226 can be coupled to a speaker 2228 and a microphone 2230 to facilitate voice-enabled functions, such as voice recognition, voice replication, digital recording, and telephony functions. The I/O subsystem 2240 can include a touch screen controller 2242 and/or other input controller(s) 2244. The touch-screen controller 2242 can be coupled to a touch screen 2246. The touch screen 2246 and touch screen controller 2242 can, for example, detect contact and movement or break thereof using any of multiple touch sensitivity technologies, including but not limited to capacitive, resistive, infrared, and surface acoustic wave technologies, as well as other proximity sensor arrays or other elements for determining one or more points of contact with the touch screen 2246.

The other input controller(s) 2244 can be coupled to other input/control devices 2248, such as one or more buttons, rocker switches, thumb-wheel, infrared port, USB port, and/or a pointer device such as a stylus. The one or more buttons (not shown) can include an up/down button for volume control of the speaker 2228 and/or the microphone 2230.

In one implementation, a pressing of the button for a first duration may disengage a lock of the touch screen 2246; and a pressing of the button for a second duration that is longer than the first duration may turn power to the mobile device 59 on or off. The user may be able to customize a functionality of one or more of the buttons. The touch screen 2246 can, for example, also be used to implement virtual or soft buttons and/or a keyboard.

In some implementations, the mobile device 59 can present recorded audio and/or video files, such as MP3, AAC, and MPEG files. In some implementations, the mobile device 59 can include the functionality of an MP3 player. The mobile device 59 may, therefore, include a 32-pin connector that is compatible with the MP3 player. Other input/output and control devices can also be used.

The memory interface 2202 can be coupled to memory 2250. The memory 2250 can include high-speed random access memory and/or non-volatile memory, such as one or more magnetic disk storage devices, one or more optical storage devices, and/or flash memory (e.g., NAND, NOR). The memory 2250 can store an operating system 2252, such as Darwin, RTXC, LINUX, UNIX, OS X, ANDROID, IOS, WINDOWS, or an embedded operating system such as VxWorks. The operating system 2252 may include instructions for handling basic system services and for performing hardware dependent tasks. In some implementations, the operating system 2252 can be a kernel (e.g., UNIX kernel).

The memory 2250 may also store communication instructions 2254 to facilitate communicating with one or more additional devices, one or more computers and/or one or more servers. The memory 2250 may include graphical user interface instructions 2256 to facilitate graphic user interface processing including presentation, navigation, and selection within an application store; sensor processing instructions 2258 to facilitate sensor-related processing and functions; phone instructions 2260 to facilitate phone-related processes and functions; electronic messaging instructions 2262 to facilitate electronic-messaging related processes and functions; web browsing instructions 2264 to facilitate web browsing-related processes and functions; media processing instructions 2266 to facilitate media processing-related processes and functions; GPS/Navigation instructions 2268 to facilitate GPS and navigation-related processes and instructions; camera instructions 2270 to facilitate camera-related processes and functions; and/or other software instructions 2272 to facilitate other processes and functions.

Each of the above identified instructions and applications can correspond to a set of instructions for performing one or more functions described above. These instructions need not be implemented as separate software programs, procedures or modules. The memory 2250 can include additional instructions or fewer instructions. Furthermore, various functions of the mobile device 59 may be implemented in hardware and/or in software, including in one or more signal processing and/or application specific integrated circuits.

Having thus described the different embodiments of a system and method, it should be apparent to those skilled in the art that certain advantages of the described method and apparatus have been achieved. In particular, it should be appreciated by those skilled in the art that the proposed method provides for efficient processing of audio signals of the remote desktop applications on a mobile device.

It should also be appreciated that various modifications, adaptations, and alternative embodiments thereof may be made within the scope and spirit of the present invention. The invention is further defined by the following claims.

What is claimed is:

1. A system for processing a selected audio stream transmitted to a mobile device, the system comprising:
  a host configured to execute applications, the host receiving data from the mobile device through a network connection;
  an audio processing engine implemented on the host, the engine configured to process audio streams from the applications;
  a plurality of host audio processing filters, wherein the filters are controlled by commands received from the mobile device;
  the host is configured to send images of the applications to the mobile device;
  the host is configured to send a common audio stream that is common to all the applications running on the host, to the mobile device;
  the mobile device is configured to show on a screen a single application window and to send, to the host, an ID of the application related to the window;
  the mobile device is configured to play the selected audio stream received from the host; and
  the host is configured to receive IDs for all the applications from the mobile device along with volume settings for audio filters corresponding to the IDs, and apply volume settings to the audio filters,
  wherein the mobile device is configured to increase volume of the selected audio stream for the application related to the window and whose window is shown on the screen.

2. The system of claim 1, wherein the system checks if the ID of the application window shown on the screen corresponds to an ID of the host application having an increased volume in the common audio stream, and reduces overall audio stream volume on the mobile device, if the IDs do not match.

3. The system of claim 1, wherein the system checks a volume of system sounds that cannot be controlled by the filters on the host and changes host system configurations in order to reduce an effect of the system sounds on the common audio stream by increasing the volume of the selected audio stream and reducing overall audio stream volume on the remote host or vice versa.

4. The system of claim 1, wherein switching between application windows on the mobile device is performed gradually and a volume of an audio stream of each of the applications corresponds to a portion of the screen occupied by the corresponding application.

5. The system of claim 1, wherein the host sends the selected audio stream to the mobile device via a cloud.

6. The system of claim 1, wherein the selected audio stream is an encoded output of a virtual sound card implemented on the host.

7. The system of claim 1, wherein the mobile device reflects the applications that are running on different hosts in the cloud, wherein an audio stream of each host is controlled and transmitted to the mobile device separately.

8. The system of claim 7, wherein if no application from a particular host is reflected on the mobile device, an audio stream from that host is not played by the mobile device.

\* \* \* \* \*